(12) United States Patent
Seo et al.

(10) Patent No.: US 8,981,804 B2
(45) Date of Patent: Mar. 17, 2015

(54) CONTACT APPARATUS AND SEMICONDUCTOR TEST EQUIPMENT USING THE SAME

(75) Inventors: Hun-Kyo Seo, Asan-si (KR); Soon-Geol Hwang, Cheonan-si (KR); Jang-Sun Kim, Gwangmyeong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 309 days.

(21) Appl. No.: 13/530,273

(22) Filed: Jun. 22, 2012

(65) Prior Publication Data
US 2013/0088250 A1    Apr. 11, 2013

(30) Foreign Application Priority Data

Oct. 6, 2011    (KR) .......................... 10-2011-0101914

(51) Int. Cl.
*G01R 31/26* (2014.01)
*G01R 1/04* (2006.01)
*G01R 31/28* (2006.01)

(52) U.S. Cl.
CPC .......... *G01R 1/0466* (2013.01); *G01R 31/2889* (2013.01)
USPC ................................... 324/754.11; 324/754.1

(58) Field of Classification Search
USPC ............... 324/754.11, 750.25, 754.04, 754.1
See application file for complete search history.

(56) References Cited

U.S. PATENT DOCUMENTS 6,573,739 B1 *    6/2003   Saito ........................ 324/750.25

FOREIGN PATENT DOCUMENTS

| JP | 11-133105 A | 5/1999 |
| JP | 11-329646 A | 11/1999 |
| JP | 2002-228705 A | 8/2002 |
| KR | 10-2010-117377 A | 11/2010 |

\* cited by examiner

*Primary Examiner* — Vincent Q Nguyen
(74) *Attorney, Agent, or Firm* — Lee & Morse, P.C.

(57) ABSTRACT

A contact apparatus includes a pusher having first and second surfaces, the first surface being connected to a pressure unit, stoppers protruding from edges of the second surface of the pusher away from the pressure unit, a pusher block having first and second surfaces facing each other, the first surface facing the pusher, and the second surface being connected to a semiconductor device, coupling members connecting the pusher to the pusher block, and a connector disposed between the pusher and the pusher block, at least part of a surface of the connector being circular, and the circular surface making a point contact with the pusher or the pusher block.

20 Claims, 11 Drawing Sheets

CONTACT APPARATUS AND SEMICONDUCTOR TEST EQUIPMENT USING THE SAME

CROSS-REFERENCE TO RELATED APPLICATION

This application claims priority from Korean Patent Application No. 10-2011-0101914 filed on Oct. 6, 2011 in the Korean Intellectual Property Office, the disclosure of which is incorporated herein by reference in its entirety.

BACKGROUND

1. Field

Example embodiments relate to a contact apparatus and a semiconductor test equipment and method using the same.

2. Description of the Related Art

Semiconductor devices are becoming lighter, thinner, shorter, and smaller. Accordingly, it has become important to test such semiconductor devices in a stable manner. To test a semiconductor device stably, a contact force between the semiconductor device and test equipment is very important. The contact force is also very important for smooth exchange of electrical signals between solder balls of the semiconductor device and socket pins, and also significantly affects the product yield. For example, when the material of the solder balls is changed from a Pb-containing material to a harder material that contains SnAgCu, if test conditions remain unchanged, the yield of the semiconductor packages may be reduced. In addition, if a greater force is applied between the semiconductor package and the test equipment in order to secure the contact force, the solder balls are deformed, resulting in a reduction in yield and poor appearance.

SUMMARY

Aspects of the example embodiments provide a contact apparatus which can apply a uniform contact force using a connector making a point contact with a pusher or a pusher block.

Aspects of the example embodiments also provide semiconductor test equipment which tests a semiconductor device using the contact apparatus.

According to an aspect of the example embodiments, there is provided a contact apparatus including a pusher having first and second surfaces, the first surface being connected to a pressure unit, stoppers protruding from edges of the second surface of the pusher away from the pressure unit, a pusher block having first and second surfaces facing each other, the first surface facing the pusher, and the second surface being connected to a semiconductor device, coupling members connecting the pusher to the pusher block, and a connector disposed between the pusher and the pusher block, at least part of a surface of the connector being circular, and the circular surface making a point contact with the pusher or the pusher block.

A first end of each of the coupling members may be coupled to the pusher within an area defined between a circumference of the stoppers and a circumference of the connector, the circumference of the stoppers being defined by a line connecting the stoppers, and a second end of each of the coupling members may be coupled to the pusher block at a position outside the circumference of the connector.

The apparatus may further include at least one holder protruding from the first surface of the pusher block toward the second surface of the pusher, the at least one holder surrounding the connector.

The pusher may include a pusher body having a trench, a pusher plate covering the trench, and an elastic member placed in the trench and connecting the pusher body and the pusher plate.

The connector may make a point contact with the pusher and the pusher block.

The connector may be a sphere.

According to another aspect of the example embodiments, there is provided a semiconductor test equipment, including at least one socket, the socket including a plurality of socket pins corresponding to external terminals of a semiconductor device to be tested, socket guides fixing the socket in a stable position, a system exchanging electrical signals with the socket, and a match plate having a top surface connected to a pressure unit and a bottom surface opposite the top surface and connected to at least one contact apparatus, the contact apparatus corresponding to the socket and including a pusher having first and second surfaces parallel to each other, the first surface being connected to the match plate, stoppers protruding from edges of the second surface of the pusher away from the match plate, a pusher block having first and second surfaces parallel to each other, the first surface facing the pusher, and the second surface being connected to the semiconductor device, coupling members connecting the pusher to the pusher block, and a connector disposed between the pusher and the pusher block, at least part of a surface of the connector being spherical, and the spherical surface making a point contact with the pusher or the pusher block.

A plurality of sockets and a plurality of contact apparatuses may be arranged in a (m, n) matrix of m sockets and m contact apparatuses in a first direction and n sockets and n contact apparatuses in a second direction, the plurality of contact apparatuses correspond to respective ones of the plurality of sockets.

The (m, n) matrix may be one of (4, 8), (8, 8), (8, 16), (16, 16), and (16, 32).

The connector of the contact apparatus may make a point contact with the pusher block.

The connector of the contact apparatus may make a point contact with the pusher.

The connector of the contact apparatus may make a point contact with the pusher and the pusher block.

The connector may be a sphere.

The pusher may include a trench in the second surface, the connector and the pusher being connected to each other within the trench.

A first end of each of the coupling members may be coupled to the pusher within an area defined between a line connecting the stoppers and a circumference of the connector, and a second end of each of the coupling members may be coupled to the pusher block at a position outside the circumference of the connector, and the contact apparatus may further include at least one holder protruding from the first surface of the pusher block toward the second surface of the pusher, the at least one holder surrounding the connector.

The pusher may include a pusher body having a trench, a pusher plate covering the trench, and an elastic member placed in the trench and connecting the pusher body and the pusher plate.

According to another aspect of the example embodiments, there is provided a contact apparatus, including a pusher having first and second surfaces facing each other, the first surface being connected to a pressure unit, a pusher block having first and second surfaces facing each other, the first surface facing the pusher, and the second surface being connected to a semiconductor device, at least one coupling member connecting the pusher to the pusher block, a connector between the pusher and the pusher block, the connector including at least one circular surface tangentially contacting at least one of the pusher and the pusher block, and at least one holder configured to prevent movement of the connector along a horizontal direction substantially parallel to a surface supporting the contact apparatus.

The connector may be a sphere in direct contact with the pusher and the pusher block.

The holder may surround the connector.

The connector may be non-stationary.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
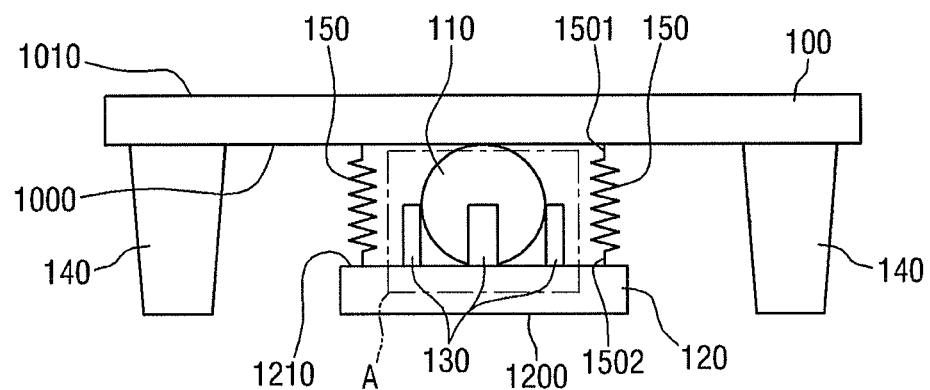
FIG. 1 illustrates a diagram of a contact apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. It will also be understood that when an element is referred to as being "connected to" or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the example embodiments.

The use of the terms "a," "an," and "the" are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, contact apparatuses according to embodiments will be described with reference to FIGS. 1 through 10C.

Figure 2:
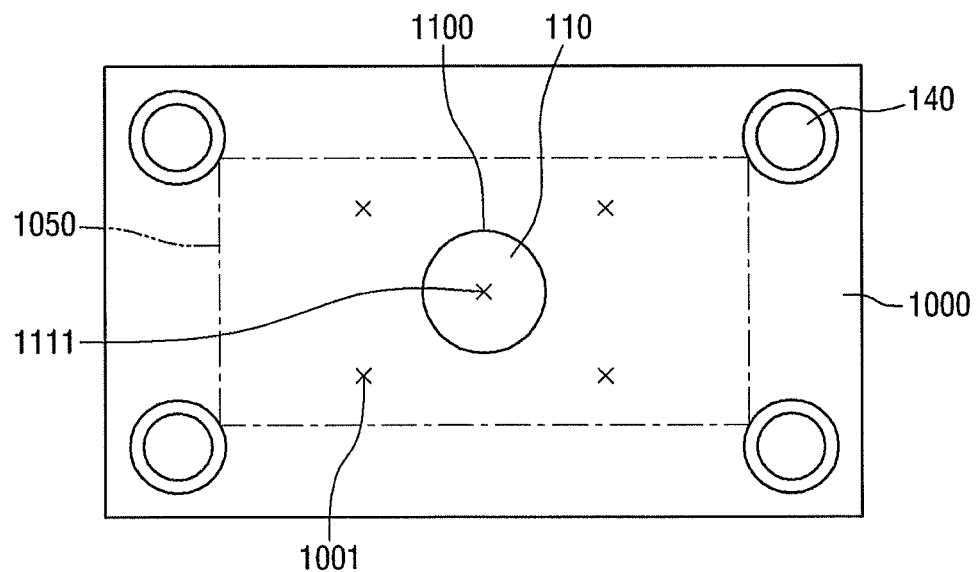
FIG. 2 illustrates a diagram of a connector on a pusher that has stoppers in the contact apparatus of FIG. 1.
Figure 3:
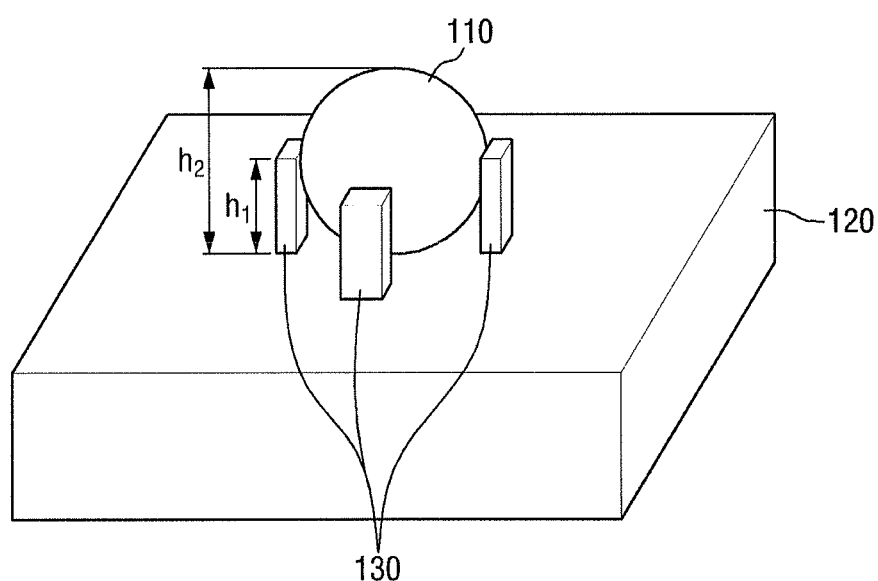
FIG. 3 illustrates a perspective view of region 'A' shown in FIG. 1.
Figure 4A:
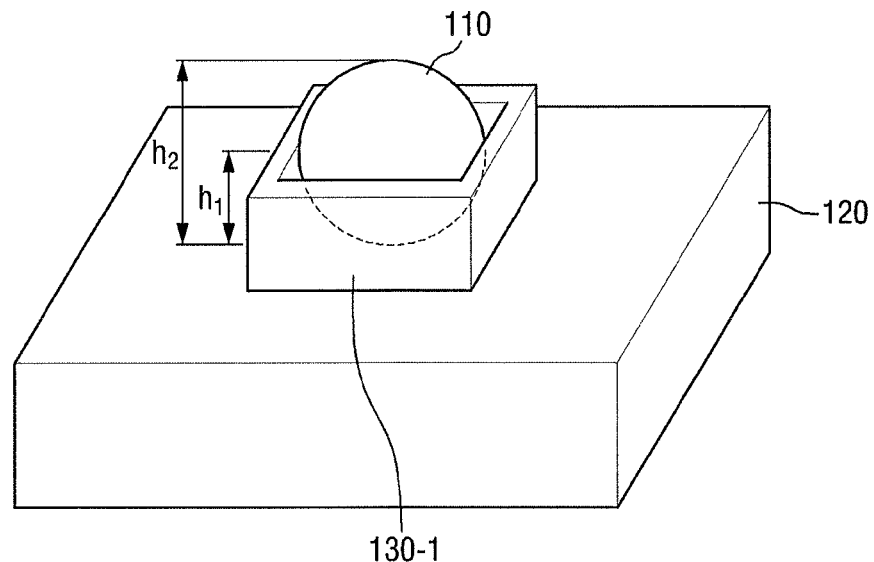
FIGS. 4A and 4B illustrate diagrams of various shapes of holders in contact apparatuses according to embodiments.
Figure 4B:
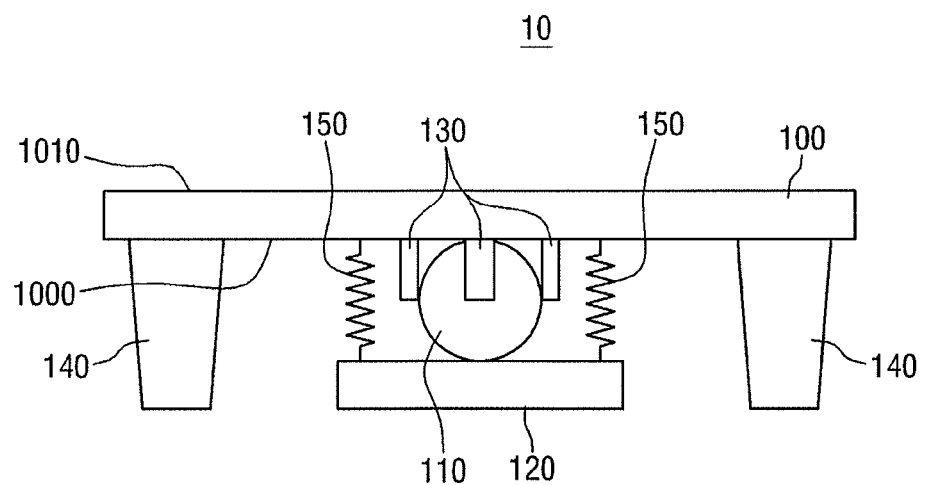
Figure 5A:
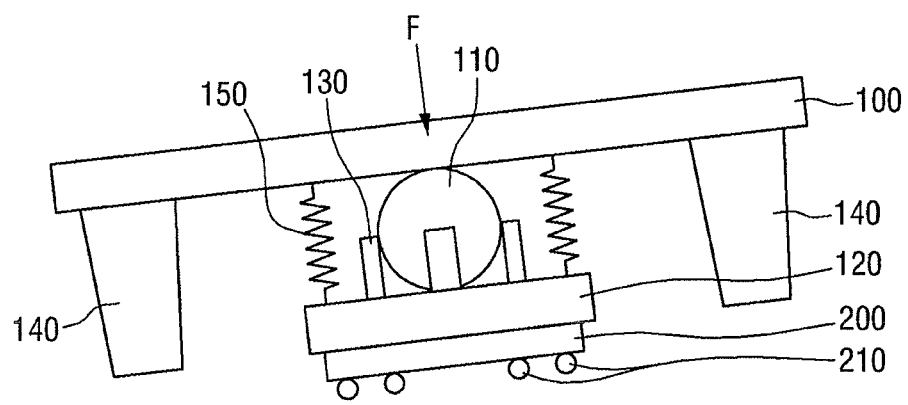
FIGS. 5A through 5C illustrate diagrams of a semiconductor device and socket pins in contact with each other via the contact apparatus of FIG. 1.
Figure 5A:
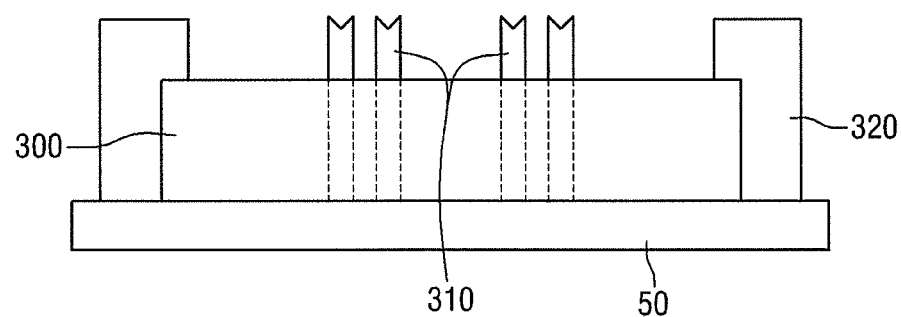
Figure 5B:
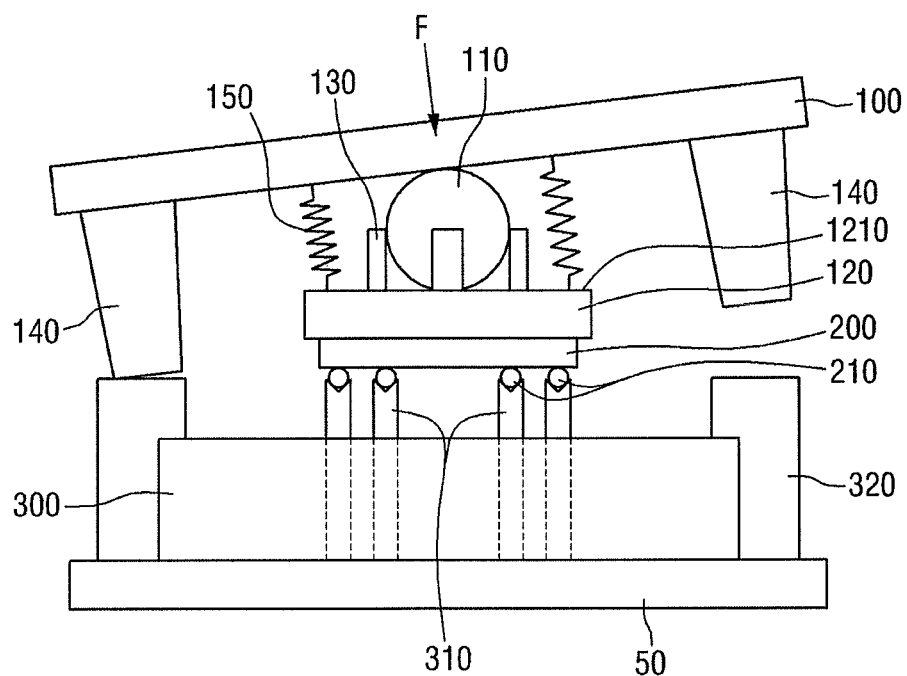
Figure 5C:
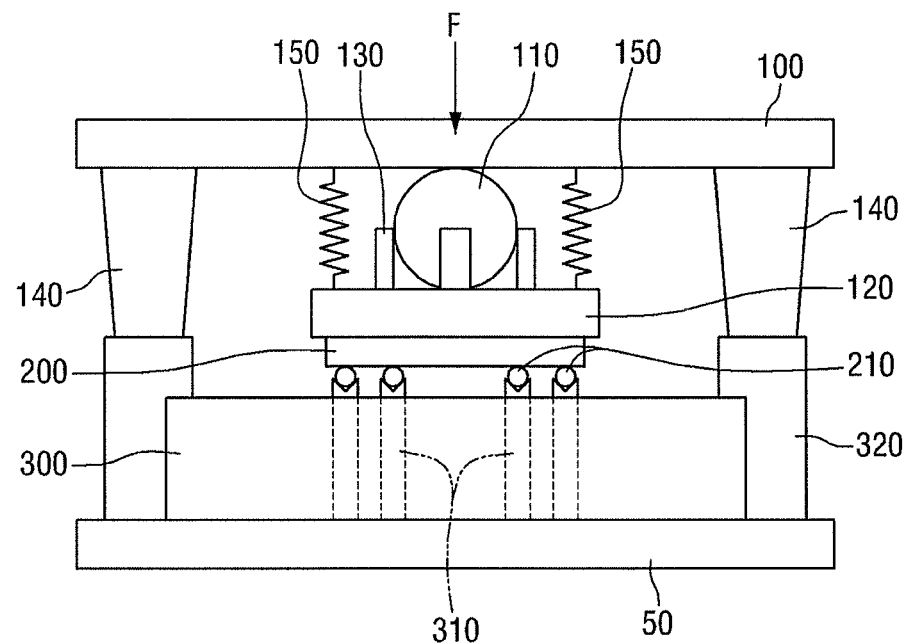
Figure 6A:
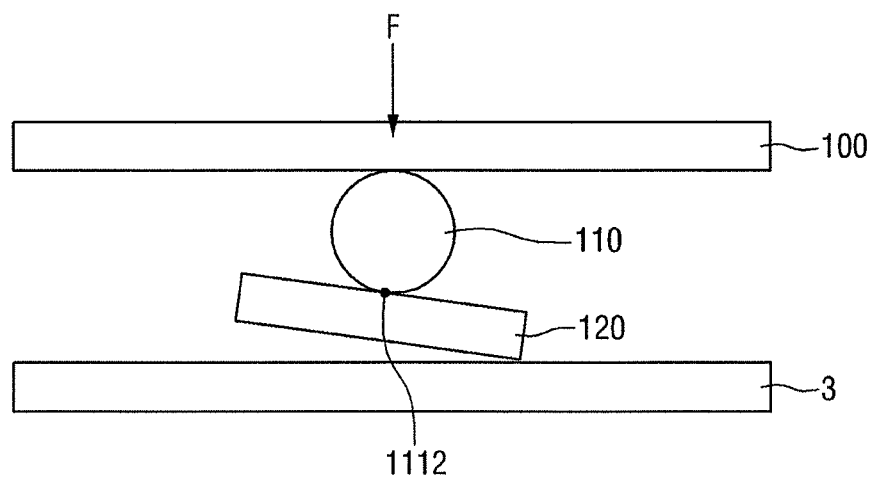
FIGS. 6A through 6C illustrate diagrams of the movement of the pusher, a pusher block, and the connector in the contact apparatus of FIG. 1.
Figure 6B:
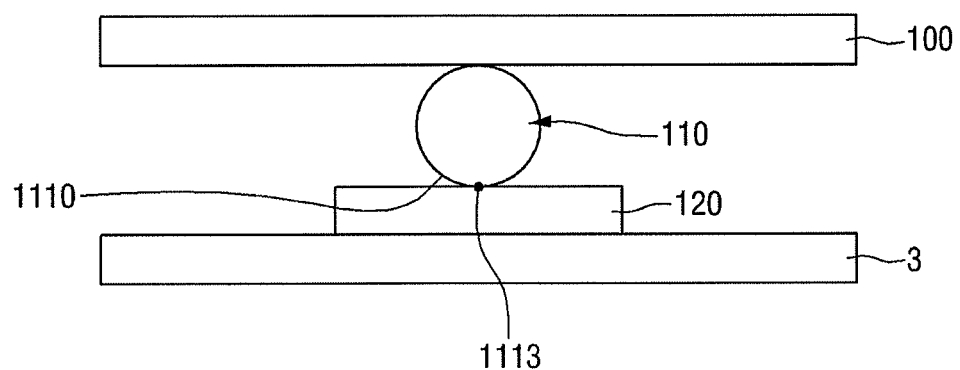
Figure 6C:
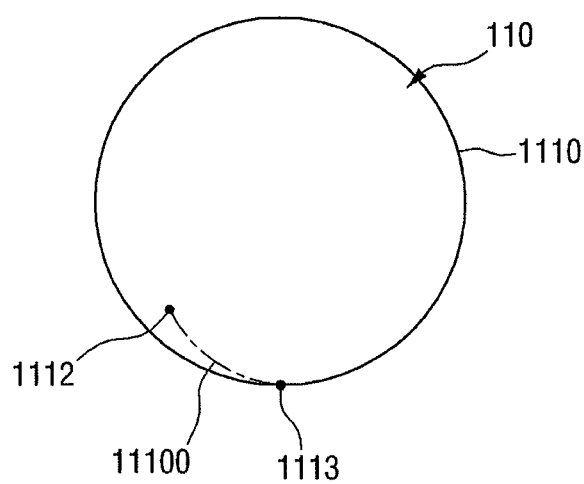
Figure 7:
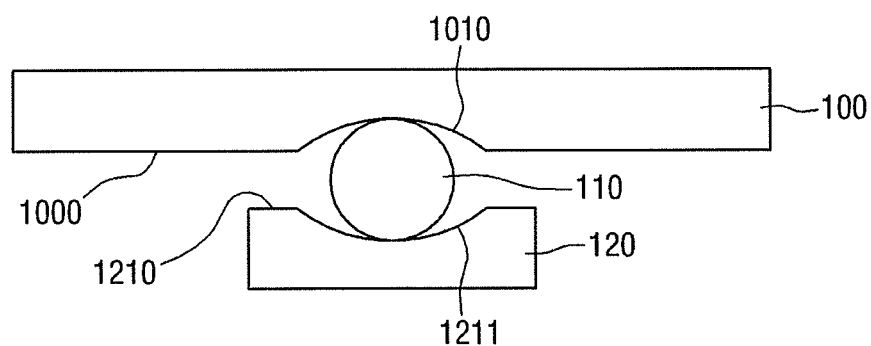
FIGS. 7 and 8 illustrate diagrams of a modified embodiment of a contact apparatus of FIG. 1.
Figure 8:
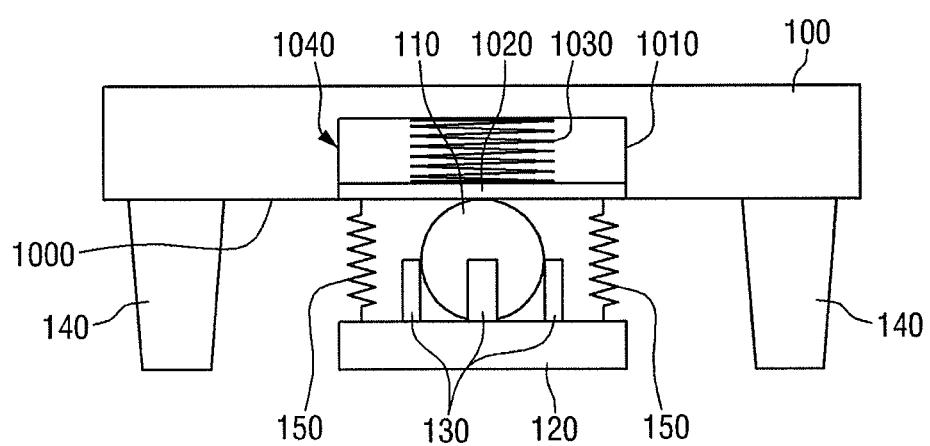
Figure 9A:
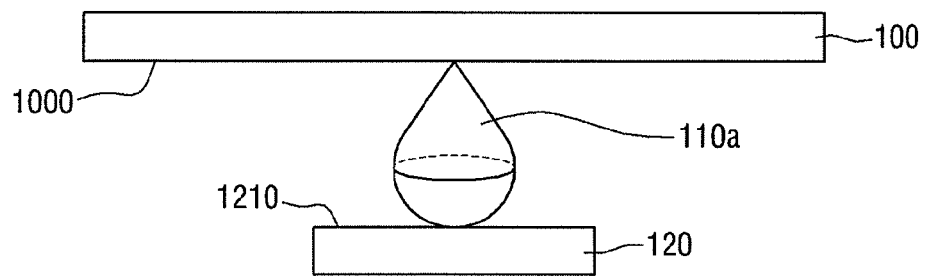
FIGS. 9A through 9C illustrate diagrams of various shapes of the connector used in the contact apparatuses of FIGS. 1 and 9.
Figure 9B:
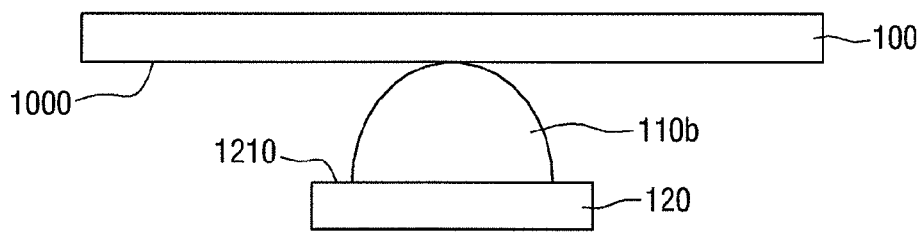
Figure 9C:
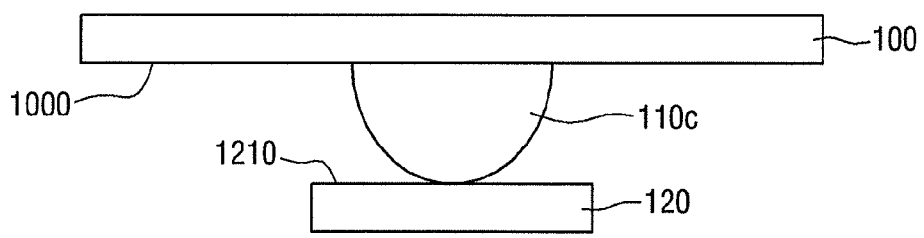

FIG. 1 is a schematic diagram of a contact apparatus 10 according to an embodiment. FIG. 2 is a diagram illustrating a plane view of a connector 110 on a pusher 100 in the contact apparatus 10. FIG. 3 is a perspective view of region 'A' shown in FIG. 1. FIGS. 4A and 4B are diagrams of holders of contact apparatuses according to embodiments. FIGS. 5A through 5C are diagrams illustrating the semiconductor device 200 and the socket pins 310 in contact with each other via the contact apparatus 10. FIGS. 6A through 6C are diagrams of the movement of the pusher 100, a pusher block 120, and the connector 110 in the contact apparatus 10. FIGS. 7 and 8 are diagrams of a modified contact apparatus 10'. FIGS. 9A through 9C are diagrams of the connector 110 in the contact apparatuses 10 and 10'.

Referring to FIGS. 1 through 4B, the contact apparatus 10 may include the pusher 100, the connector 110, the pusher block 120, stoppers 140, holders 130, and coupling members 150.

Referring to FIG. 1, the pusher 100 transfers a force received from a pressure unit to the pusher block 120. A first surface 1010 of the pusher 100 may be connected to the pressure unit, and a second surface 1000 of the pusher 100 which faces and is parallel with the first surface 1010 may be connected to the connector 110, the coupling members 150, and the stoppers 140. In the drawings, the shape of the pusher 100 according to the current embodiment is a hexahedron. However, the shape of the pusher 100 is not limited to the hexahedron.

The connector 110 is interposed between the pusher 100 and the pusher block 120, e.g., the connector 110 is connected to a geometric center of the second surface 1000 of the pusher 100 and to a geometric center of a top surface 1210 of the pusher block 120. At least part of the connector 110 includes a spherical surface, and the connector 110 makes a point contact, i.e., a point of contact, with the pusher 100 and/or the pusher block 120 via the spherical surface.

That is, the spherical surface of the connector 110 may make a point contact with the pusher block 120 and/or the pusher 100, e.g., the connector 110 may be a sphere contacting each of the pusher 100 and pusher block 120. In the contact apparatus 10 of FIG. 1, the connector 110 is spherical and makes a point contact with the pusher 100 and the pusher block 120. However, example embodiments are not limited thereto. While a case where the connector 110 according to the current embodiment is a sphere will hereinafter be described as an example, example embodiments are not limited thereto. Various shapes of the connector 110 will be described later with reference to FIGS. 9A through 9C.

The pusher block 120 is separated from the pusher 100, may make a point contact with the connector 110, and transfers a force received from the pusher 100 to the semiconductor device 200 (see FIG. 5C). For example, the top surface 1210 of the pusher block 120 may make a point contact with the connector 110 and may be connected to the coupling members 150 or the holders 130. A bottom surface 1200 of the pusher block 120 is connected to the semiconductor device 200. The pusher block 120 directly applies a force to the semiconductor device 200 and the socket pins 310 (see FIG. 5C) which are brought into contact with each other. In the drawings, the shape of the pusher block 120 according to the current embodiment is a hexahedron. However, the shape of the pusher block 120 is not limited to the hexahedron.

The stoppers 140 may protrude from edges of the second surface 1000 of the pusher 100. For example, as illustrated in FIGS. 1 and 4B, the stoppers 140 may be shaped like cylinders. However, the shape of the stoppers 140 is not limited to a cylinder. The number of stoppers 140 may vary according to the shape of the second surface 1000 of the pusher 100 and the shape of socket guides 320 (see FIG. 5C). The stoppers 140 may be respectively connected to the socket guides 320 at corresponding positions so as to control a force acting on the semiconductor device 200 not to exceed a predetermined value. That is, the stoppers 140 control a distance by which the socket pins 310 are pressed by the semiconductor device 200, regardless of a force applied to the contact apparatus 10 by the pressure unit.

The coupling members 150 may connect the pusher 100 and the pusher block 120 to each other, such that they are not separated from each other. A first end 1501 of each of the coupling members 150 may be connected to the pusher 100, and a second end 1502 of each of the coupling members 150 may be connected to the pusher block 120. The coupling members 150 may connect the pusher 100 and the pusher block 120 together, e.g., keep the pusher 100 and the pusher block 120 at a sufficient constant distance, such that the connector 110 is kept in point contact at least with one of the pusher block 120 and the pusher 100. The coupling members 150 may be, e.g., wires or elastic members.

Referring to FIG. 2, the connector 110 may be connected to the second surface 1000 of the pusher 100 at a point 1111. The first end 1501 of each of the coupling members 150 is connected to the second surface 1000 of the pusher 100 within an area 1050 surrounding the point 1111, i.e., an area between the stoppers 140 and a circumference 1100 of the connector 110. That is, the coupling members 150 may be connected to the second surface 1000 of the pusher 100 at any positions within an area defined by the stoppers 140, e.g., an area between the stoppers 140 and the connector 110 and defined by connecting four outer points (points facing the connector 110) of respective four stoppers 140, as long as the coupling members 150 do not interfere with the movement of the connector 110. For example, when the connector 110 is seen in a plane view, the circumference 1100 of the connector 110 is a closed curve that forms the rim of the connector 110. The second end 1502 of each of the coupling members 150 is connected to the pusher block 120 at an edge of the top surface 1210 of the pusher block 120. A position 1001 at which the first end 1501 of each of the coupling members 150 is connected to the pusher 100 may correspond to a position at which the second end 1502 of each of the coupling members 150 is connected to the pusher block 120. However, example embodiments are not limited thereto. In FIG. 2, the number of coupling members 150 is four. However, the number of coupling members 150 is not limited to four. The number of coupling members 150 may be determined, e.g., in view of the pusher 100, the pusher block 120, the number of holders 130, the shape of the connector 110, and the like.

Referring to FIGS. 1 and 3, the holders 130 prevent the connector 110 from moving out of position between the pusher 100 and the pusher block 120. The holders 130 may be interposed between the coupling members 150 and the connector 110, and may protrude from the top surface 1210 of the pusher block 120 toward the pusher 100. The connector 110 may be disposed among the holders 130, i.e., in a space formed by the holders 130, so the holders 130 may surround the connector. For example, the holders 130 may be a plurality of separate members spaced apart from each other along a perimeter of the connector 110, e.g., the holders 130 may be shaped like square pillars and may be arranged to form a square. However, example embodiments are not limited thereto, e.g., the holders 130 may be cylindrical or prismatic pillars and may be arranged in any suitable geometrical arrangement. The number of holders 130 may vary according to, e.g., the shape of the connector 110. The holders 130 may not be necessary when the connector 110 is fixed to the pusher 100 or the pusher block 120. A height h1 of the holders 130 is smaller than a height h2 of the connector 110. The height h1 of the holders 130 should be small enough to prevent the holders 130 from touching the second surface 1000 of the pusher 100, when the connector 110 between the pusher 100 and the pusher block 120 moves. For example, as illustrated in FIG. 3, the holders 130 may be closely attached to the connector 110, e.g., each one of the holders 130 may directly contact the connector 110. However, example embodiments are not limited thereto, e.g., the holders 130 may be separated from the connector 110.

For example, as shown in FIG. 4A, a holder 130-1 may be shaped like a continuous frame surrounding a perimeter, e.g., an entire perimeter, of the connector 110, e.g., the holder 130-1 may be shaped like a polygonal box. The connector 110 may be placed inside the box-shaped holder 130-1, and the height h1 of the box-shaped holder 130-1 may be smaller than the height h2 of the connector 110. In another example, as shown in FIG. 4B, holders 130' may be formed on the on the second surface 1000 of the pusher 100, instead of the pusher block 120, to prevent the connector 110 from moving out of position.

Problems that arise when a conventional contact apparatus, e.g., an apparatus having a pusher and a pusher block without the connector 110 therebetween, is used to connect a semiconductor device to a socket will now be described. When the conventional contact apparatus is used to connect a semiconductor device to a socket, the applied force cannot be applied simultaneously to all the external terminals of the semiconductor device, thereby causing sequential, rather than simultaneous, connection between the plurality of external terminals and corresponding socket pins. Such sequential connection may cause application of excessive force to some of the external terminals and/or corresponding socket pins, thereby causing deformation of the external terminals and/or corresponding socket pins.

In detail, in the conventional contact apparatus, the pusher, pusher block, and semiconductor device may be sequentially stacked to extend in the horizontal direction, so force may be applied through the pusher block to connect the semiconductor device to a socket. The force may be applied from a pressure unit to the pusher block through the pusher, so the pusher block may, in turn, apply the force onto the semiconductor device. This complicated force transfer process makes it difficult for the stoppers to contact the socket guides simultaneously, even if the contact apparatus is manufactured precisely. That is, the conventional contact apparatus with the semiconductor device may approach the socket only at an angle, so the external terminals of the semiconductor device may not simultaneously contact the socket pins of the socket, i.e., only some of the external terminals of the semiconductor device may contact some of the socket pins initially. While eventually the stoppers contact the socket guides and all of the external terminals contact all of the socket pins, the initial period, i.e., during which only some of the external terminals and socket pins continuously receive all the force applied by the pusher block, may cause deformation of the external terminals and socket pins that receive excessive force.

That is, the force from the pusher block acts on the semiconductor device. Since the pusher, the pusher block, and the semiconductor device are connected to each other, and thus, cannot move freely, the entire force from the pusher block is applied to only some of the external terminals and socket pins that contact each other initially. In other words, the force from the pusher block is not distributed evenly, i.e., the force is concentrated in a limited contact area. Further, as the force is normal to the pusher block, which approaches the socket at an angle, the force is angled with respect to the socket pins, thereby having both vertical and horizontal components. The horizontal component of the force acts on the socket pins in a direction orthogonal to a lengthwise direction of the socket pins, thereby deforming the socket pins.

The deformed socket pins may make it difficult to ensure a stable contact force between the semiconductor device and the socket. In addition, the replacement cycle of the socket pins (which are expendables) may be shortened, thus increasing maintenance costs. Furthermore, the force acting on the external terminals of the semiconductor device may increase, i.e., due to a horizontal force component generated due to the direction of the force, thereby causing deformation of the external terminals, poor product appearance, and adherence (which causes poor contact) between the external terminals and the socket pins.

In contrast, according to example embodiments, since the contact apparatus 10 includes the connector 110 between the pusher 100 and the pusher block 120, simultaneous connection between all the external terminals of the semiconductor device and socket pins of the socket may occur. In detail, referring to FIGS. 5A through 5C, a simultaneous connection between external terminals 210 of a semiconductor device 200 and corresponding socket pins 310 of a socket 300 using the contact apparatus 10 according to the current embodiment will be described.

Referring to FIG. 5A, the semiconductor device 200 may be connected to the pusher block 120. The semiconductor device 200 and the pusher 100 face each other to be parallel to each other, as illustrated in FIG. 5A. However, example embodiments are not limited thereto, e.g., the semiconductor device 200 may be connected to the contact apparatus 10 by a semiconductor device transfer unit (not shown), so the semiconductor device 200 and the pusher 100 may not be parallel to each other.

When a force F is applied to the contact apparatus 10 to which the semiconductor device 200 is connected, the contact apparatus 10 approaches the socket 300, e.g., the pusher 100 may approach the socket 300 at an angle. Accordingly, the distance between the contact apparatus 10 and the socket 300 is reduced, and the contact apparatus 10 contacts the socket 300. Depending on an angle of the contact apparatus 10 to the socket 300, the stoppers 140 may first contact the socket guides 320, or the external terminals 210 may first contact the socket pins 310. However, even when the external terminals 210 first contact the socket pins 310, not all of the force F applied by the pusher 100 acts between some of the external terminals 210 and some of the socket pins 310 which are in contact with each other. This is because the connector 110 including at least a partially spherical surface and disposed between the pusher 100 and the pusher block 120 makes a point contact with the pusher 100 and/or the pusher block 120 and can move freely.

In other words, due to the spherical surface of the connector 110, the pusher block 120, to which the semiconductor device 200 is connected, rotates about the contact areas between some of the external terminals 210 and some of the socket pins 310. Thus, the force F applied by the pusher 100 is not concentrated on a limited number of the external terminals 210 and socket pins 310 which are in contact with each other. Instead, part of the force F may act as torque that rotates the pusher block 120 to which the semiconductor device 200 is connected. Therefore, the force F applied by the pusher 100 is not concentrated between some of the external terminals 210 and some of the socket pins 310.

Referring to FIG. 5B, all of the external terminals 210 may be in contact with all of the socket pins 310. The stoppers 140 may be partially in contact with the socket guides 320, so the pusher 100 may not be parallel to the pusher block 120, i.e., may be at an angle. This is because the length of the slightly elastic coupling members 150 can change according to the distance between the pusher 100 and the pusher block 120. A direction of the force F applied by the pusher 100 forms a certain angle to a normal of the top surface 1210 of the pusher block 120. Even if the direction of the force F is at the certain angle to the normal of the top surface 1210 of the pusher block 210, the direction of a force acting between the external terminals 210 and the socket pins 310 is along the lengthwise direction of the socket pins 310, i.e., due to a characteristic of an object having a spherical surface.

In detail, the direction of a force acting between a flat surface and a spherical surface in contact with the flat surface is always along a normal to a tangent line to the spherical surface at the contact point. That is, the direction of a force between a flat surface contacting a spherical surface is always along a normal to the flat surface, as the flat surface defines a tangent line of the spherical surface at their contact point. Accordingly, even if the force F acting on the pusher 100 is directed at an oblique angle with respect to the pusher 100, the force F is transferred to the pusher block 120 via the spherical surface of the connector 110 along a normal direction to the pusher block 120. That is, as any force directed from a spherical surface contacting the pusher block 120 will be along a normal direction to the pusher block 120, the force F will be directed from the spherical surface of the connector 110 contacting the pusher block along a normal direction to the pusher block 120. Therefore, when the pusher block 120 is substantially perpendicular to the socket pins 310, the force F is transferred through the pusher block 120 along the lengthwise direction of the socket pins 310 (even if original the force F was angled with respect to the pusher 100). Accordingly, even when the pusher 100 and the pusher block 120 are at an oblique angle to each other, a uniform force acts between the external terminals 210 and the socket pins 310.

Referring to FIG. 5C, all of the external terminals 210 are in contact with all of the socket pins 310, and all of the stoppers 140 are in contact with all of the socket guides 320. Even if the force F is continuously applied, since all of the stoppers 140 are in contact with all of the socket guides 320, the contact apparatus 10 no longer moves toward the socket 300. That is, the distance by which the socket pins 310 are pressed by the external terminals 210 remains unchanged. Therefore, a desired uniform contact force can be ensured between the socket pins 310 and the external terminals 210.

The movement between the pusher 100, the pusher block 120, and the connector 110 will now be described with reference to FIGS. 6A through 6C. Specifically, the rotation of the pusher block 120 by the force F will be described.

Referring to FIG. 6A, the pusher block 120 contacts a flat plate 3 at a point and contacts the connector 110 at a first contact point 1112 on a spherical surface 1110 of the connector 110. When the force F is transferred to the pusher block 120 via the connector 110, the pusher block 120 rotates about the contact point between the pusher block 120 and the flat plate 3. The rotation of the pusher block 120 brings the pusher block 120 into contact with the connector 110 at a second contact point 1113, as illustrated in FIG. 6B.

When the pusher block 120 does not contact the entire surface of the flat plate 3, the pusher block 120 does not transfer all of the force F to the flat plate 3. That is, part of the force F is used to rotate the pusher block 120. The pusher block 120 transfers all of the force F to the flat plate 3 only after it rotates to contact the entire surface of the flat plate 3. The contact point between the connector 110 and the pusher block 120 on the spherical surface 1110 of the connector 110 moves from the first contact point 1112 to the second contact point 1113 along a path 11100 on the spherical surface 1110, as illustrated in FIG. 6C.

Modified examples of a contact apparatus according to embodiments will now be described with reference to FIGS. 7 and 8.

Referring to FIG. 7, a contact apparatus may include trenches 1010 and 1211 respectively formed in the second surface 1000 of the pusher 100 and the top surface 1210 of the pusher block 120. For example, as illustrated in FIG. 7, each of the trenches 1010 and 1211 may have a curved surface. However, example embodiments are not limited thereto, e.g., the trenches 1010 and 1211 may both be shaped like angled boxes or each of the trenches 1010 and 1211 may have a different shape. The trenches 1010 and 1211 may have any shape, as long as they can prevent the connector 110 between the pusher 100 and the pusher block 120 from moving out of position. Alternatively, only one of the trenches 1010 and 1211 may be formed. The trenches 1010 and/or 1211 may make a point contact with the connector 110 and may not restrict movement of the connector 110. When the trench 1010 and/or 1211 is formed in the pusher 100 or the pusher block 120, holders for preventing the connector 110 from moving out of position may not be necessary.

Referring to FIG. 8, a contact apparatus may include the pusher 100 with a pusher body 1040, a pusher plate 1020, and an elastic member 1030. In detail, the trench 1010 may be formed in the pusher body 1040, e.g., the trench 1010 may be shaped like a rectangular a box. The pusher plate 1020 may be shaped like a surface of the trench 1010, e.g., a plate with a flat rectangular surface, and may be inserted into the trench 1010. The elastic member 1030 may be placed within the trench 1010 and may connect the pusher 100 and the pusher plate 1020 together. The elastic member 1030 may be, for example, a spring. When a force applied on the pusher 100 by a pressure unit exceeds a predetermined value, the elastic member 1030 absorbs an excess force, so that a constant force is transferred to the pusher block 120.

Modified examples of the connector 110 used in the contact apparatus 10 of FIGS. 1 and 8 will now be described with reference to FIGS. 9A through 9C.

Referring to FIG. 9A, a connector 110a disposed between the pusher 100 and the pusher block 120 may make a point contact with both of the pusher 100 and the pusher block 120. A spherical surface of the connector 110a may be in point contact with the top surface 1210 of the pusher block 120. While the second surface 1000 of the pusher 100 is not in point contact with the spherical surface of the connector 110a, it is in point contact with a non-spherical surface of the connector 110a. In the drawing, the connector 110a is shaped like a combination of a hemisphere and a triangular pyramid. However, the shape of the connector 110a is not limited thereto. The connector 110a can also be shaped like a cylinder formed between hemispheres.

Referring to FIG. 9B, a connector 110b disposed between the pusher 100 and the pusher block 120 may make a point contact with only the pusher 100. In the drawing, the connector 110b is shaped like a hemisphere. However, the connector 110b can have any shape, as long as at least part of the connector 110 has a spherical surface. The spherical surface of the connector 110b may make a point contact with the second surface 1000 of the pusher 100, and the connector 110b may be fixed to the pusher block 120. When the connector 110b makes a surface contact with the pusher block 120, holders for preventing the connector 110b from moving out of position may not be formed on the pusher 100 or the pusher block 120.

Referring to FIG. 9C, a connector 110c disposed between the pusher 100 and the pusher block 120 may make a point contact with only the pusher block 120. While the connector 110c is shaped like a hemisphere in the drawing, it can have any shape, as long as at least part of the connector 110c has a spherical surface. Therefore, the shape of the connector 110c is not limited to a certain shape. The spherical surface of the connector 110c may make a point contact with the top surface 1210 of the pusher block 120, and the connector 110c may be fixed to the pusher 100. When the connector 110c makes a surface contact with the pusher 100, holders for preventing the connector 110c from moving out of position may not be formed on the pusher 100 or the pusher block 120.

Hereinafter, semiconductor test equipment according to an embodiment of the example embodiments will be described with reference to FIGS. 10 through 12. Any repetitive detailed description of elements substantially identical to those of the contact apparatus 10 described above with reference to FIGS. 1 through 9C will not be repeated.

Figure 10:
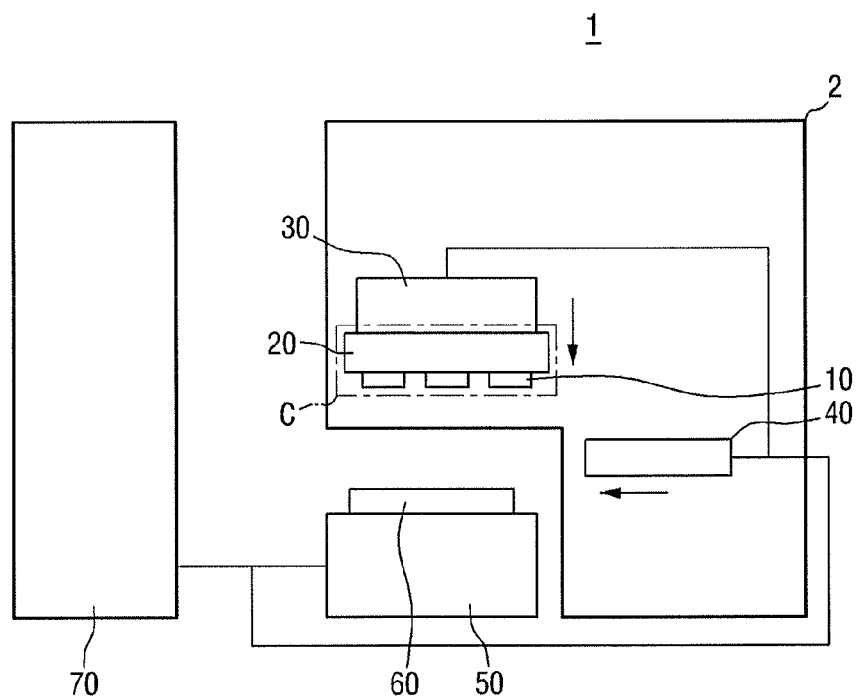
FIG. 10 illustrates a diagram of semiconductor test equipment according to an embodiment.

FIG. 10 is a diagram illustrating semiconductor test equipment 1 according to an embodiment. FIG. 11 is a diagram illustrating region 'C' shown in FIG. 10. FIG. 12 is FIG. 11 as seen in a z direction.

Referring to FIG. 10, the semiconductor test equipment 1 may include a handler 2, a test board 50, a measurement unit 60, and a system 70. The handler 2 may include contact apparatuses 10, a match plate 20, a pressure unit 30, and a transfer unit 40.

Referring to FIGS. 5C and 10, each of the contact apparatuses 10 may include the pusher 100, the connector 110, the pusher block 120, the stoppers 140, the holders 130, and the coupling members 150. The pusher 100 may or may not include a pusher body having a trench, and the holders 130 may or may not be formed depending on the shape of the connector 110 and the shape of the pusher 100 or the pusher block 120. At least a portion of a surface of the connector 110 may be spherical and may make a point contact with the pusher 100 and/or the pusher block 120.

Semiconductor devices 200 connected respectively to the contact apparatuses 10 may be, e.g., logic devices or memory devices. External terminals 210 of each of the semiconductor devices 200 may be solders, e.g., solder balls or bumps. However, these are merely examples used to describe the semiconductor test equipment 1 according to the current embodiment. The external terminals 210 may also be in the form of, e.g., a lead frame.

Figure 11:
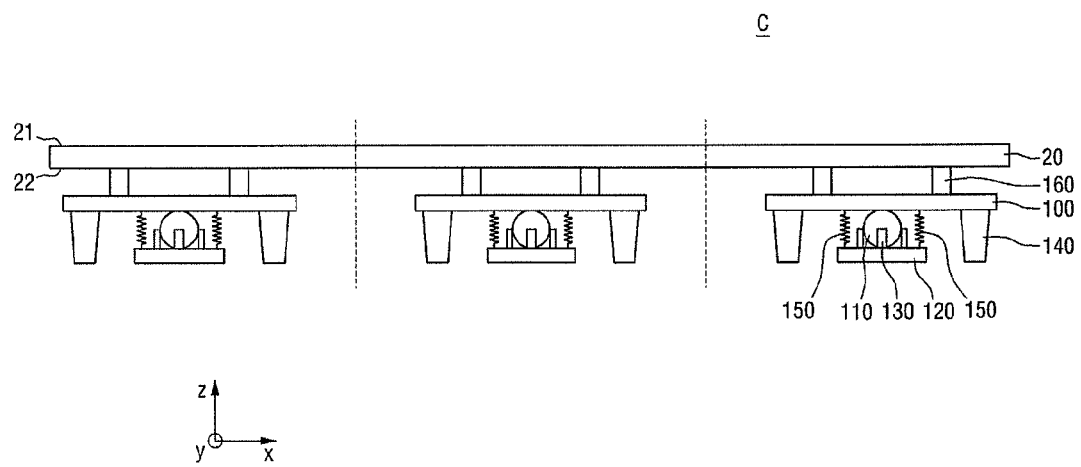
FIG. 11 illustrates a diagram of region 'C' shown in FIG. 10.

Referring to FIGS. 10 and 11, a first surface 21 of the match plate 20 may be connected to the pressure unit 30, and a second surface 22 facing the first surface 21 may be connected to the contact apparatuses 10. The match plate 20 transfers a force received from the pressure unit 30 to the contact apparatuses 10. Bridges 160 may further be provided between the match plate 20 and each of the contact apparatuses 10. The bridges 160 create a space between the match plate 20 and each of the contact apparatuses 10 for dissipating heat generated between the match plate 20 and each of the contact apparatuses 10.

The pressure unit 30 is located on the first surface 21 of the match plate 20. The pressure unit 30 is a device for applying a force so that the semiconductor devices 200 and sockets 300, i.e., external terminals 210 and socket pins 310, may be brought into contact with each other in a stable manner. The pressure unit 30 can use any pressure method as long as it can press the match plate 20 in the z direction.

The transfer unit 40 moves the semiconductor devices 200, which are to be tested, to between the contact apparatuses 10 and the measurement unit 60. The transfer unit 40 includes semiconductor device mount portions (not shown) which can accommodate the semiconductor devices 200. Holes may be formed in the semiconductor device mount portions, and the semiconductor devices 200 may be placed on the semiconductor device mount portions and moved accordingly. The external terminals 210 of the semiconductor devices 200 may be exposed through the holes formed in the semiconductor device mount portions to contact the socket pins 310. The transfer unit 40 may move the semiconductor devices 200 by hooking the semiconductor devices 200 to latches or by putting the semiconductor devices 200 into inserts. However, the transfer method used by the transfer unit 40 is not limited to the above methods.

The test board 50 may be connected to the measurement unit 60 and the system 70. The test board 50 may include a circuit which electrically connects the sockets 300 to the system 70. When the external terminals 210 of each of the semiconductor devices 200 contact the socket pins 310, the test board 50 transmits an electrical signal from the system 70 to the sockets 300 and transmits responses to the electrical signal to the system 70.

Referring to FIGS. 5C and 10, the measurement unit 60 includes the sockets 300 and socket guides 320. Each of the sockets 300 is connected to the test board 50 and may further include the socket pins 310. The sockets 300 contact the semiconductor devices 200 which are to be tested. Specifically, the socket pins 310 in each of the sockets 300 contact the external terminals 210 of one of the semiconductor devices 200. Since the external terminals 210 of the semiconductor devices 200 according to the current embodiment are solder balls, the socket pins 310 are described. However, example embodiments are not limited thereto. Since an elastic member is placed under the socket pins 310, if a force continuously acts on the socket pins 310 after the external terminals 210 of each of the semiconductor devices 200 contact the socket pins 310, the socket pins 310 may slightly move in the z direction (the lengthwise direction of the socket pins 310). The socket guides 320 are located at edges of each of the sockets 300 and fix each of the sockets 300 in position. The socket guides 320 contact the stoppers 140 to prevent the semiconductor devices 200 and the socket pins 310 from being pressed by more than a predetermined distance. The socket guides 320 may further include protruding portions (not shown) which may be connected to each of the contact apparatuses 10 and the transfer unit 40 on their respective surfaces facing the stoppers 140. Since the contact apparatuses 10, the transfer unit 40, and the protruding portions are connected to each other, the semiconductor devices 200 and the sockets 300 can be arranged approximately.

The system 70 is electrically connected to the sockets 300 by the test board 50 and is also electrically connected to the handler 2. The system 70 transmits a predetermined electrical signal to the semiconductor devices 200 and determines whether any of the semiconductor devices 200 is defective based on responses to the electrical signal from the semiconductor devices 200. The system 70 controls components of the handler 2, such that the external terminals 210 of the semiconductor devices 200 contact the socket pins 310 of the sockets 300 to produce a uniform contact force. One handler 2 and one test board 50 may be connected to the system 70. However, example embodiments are not limited thereto. That is, two handlers 2 and two test boards 50 may also be connected in parallel to one system 70 so as to determine whether the semiconductor devices 200 are defective. When two handlers 2 are connected in parallel to the system 70, a large number of memory devices can be tested simultaneously to determine whether they are defective, thereby increasing the test yield.

Figure 12:
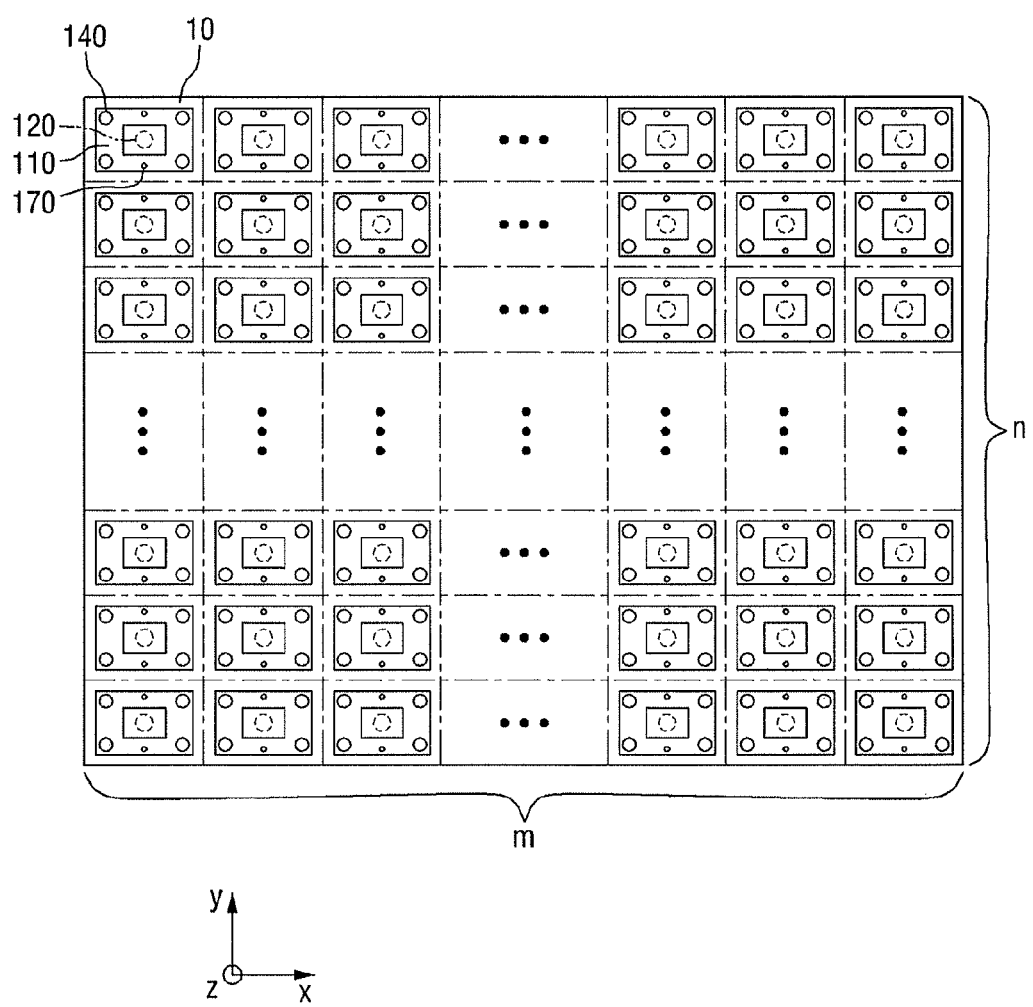
FIG. 12 illustrates FIG. 11 as seen in a z direction

Referring to FIG. 12, the contact apparatuses 10 may be arranged in a matrix on the match plate 20. In the semiconductor test equipment 1 according to the current embodiment, the size of the match plate 20, the size of the transfer unit 40, and the size of the measurement unit 60 correspond to each other. In other words, the contact apparatuses 10 connected to the match plate 20, the semiconductor device mount portions formed in the transfer unit 40, and the sockets 300 included in the measurement unit 60 may correspond to each other on a one-on-one basis. Therefore, if "m" contact apparatuses 10 in an x direction (i.e., a first direction) and "n" contact apparatuses 10 in a y direction (i.e., a second direction) are connected to the match plate 20, m semiconductor device mount portions and m sockets 300 in the first direction and n semiconductor device mount portions and n sockets 300 in the second direction may be arranged to correspond to the contact apparatuses 10 on a one-on-one basis. Here, m and n are natural numbers. To test a large number of semiconductor devices at a time using the semiconductor test equipment 1, the arrangement (m, n) of the contact apparatuses 10 connected to the match plate 20 may be, but not limited to, any one of (4, 8), (8, 8), (8, 16), (16, 16), and (16, 32).

Hereinafter, a method of testing the semiconductor devices 200 using the semiconductor test equipment 1 of FIG. 10 will be described with reference to FIGS. 5A through 5C, 10, and 11.

The semiconductor devices 200 are placed on the semiconductor device mount portions of the transfer unit 40. The semiconductor devices 200 placed on the transfer unit 40 are moved in the x direction to be positioned between the contact apparatuses 10 and the measurement unit 60. The match plate 20 is moved in the z direction by the pressure unit 30. As a result, the contact apparatuses 10 are respectively connected to the semiconductor devices 200. That is, the pusher block 120 is connected to each of the semiconductor devices 200. The approximate connection of each of the semiconductor devices 200 to the pusher block 120 is achieved by protruding portions 170 (see FIG. 12) of each of the contact apparatuses 10 and coupling portions of the transfer unit 40. The contact apparatuses 10 to which the semiconductor devices 200 are connected are moved again in the z direction by the pressure unit 30. As a result, the protruding portions 170 of the contact apparatuses 10 and the protruding portions of the socket guides 320 are inserted into the coupling portions of the transfer unit 40. Accordingly, the approximate positional relationship between the semiconductor devices 200 and the sockets 300 is determined as shown in FIG. 5A. To generate a uniform contact force between the semiconductor devices 200 and the socket pins 310, the semiconductor devices 200 are moved continuously until they contact all of the socket pins 310. Finally, the semiconductor devices 200 contact all of the socket pins 310, and all of the stoppers 140 contact all of the socket guides 320. In this state, a contact force great enough to test the semiconductor devices 200 is generated between the external terminals 210 of each of the semiconductor devices 200 and the socket pins 310.

The system 70 transmits an electric signal for a read or write operation to the semiconductor devices 200 (e.g., memory devices). Then, each of the semiconductor devices 200 transmits an electrical signal to the system 70 in response to the received electrical signal. Based on the received electrical signals, the system 70 indicates which of the semiconductor devices 200 placed on the transfer unit 40 is defective. After the test, the semiconductor devices 200 are separated from the transfer unit 40 through the processes executed in the reverse order to the above.

According to example embodiments, at least a partially spherical connector may be inserted between the pusher and the pusher block in order to direct the force during pushing along a direction of a normal to a contact plane of a spherical surface with the pusher and/or pusher block. As such, the force is directed along a lengthwise direction of the external terminals and/or socket pins, i.e., without a horizontal component, thereby providing a non-excessive force that is transferred uniformly to the external terminals and/or socket pins.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the example embodiments as set forth in the following claims.

What is claimed is:

1. A contact apparatus, comprising:
a pusher having first and second surfaces, the first surface being connected to a pressure unit;
stoppers protruding from edges of the second surface of the pusher away from the pressure unit;
a pusher block having first and second surfaces facing each other, the first surface facing the pusher, and the second surface being connected to a semiconductor device;
coupling members connecting the pusher to the pusher block; and
a connector disposed between the pusher and the pusher block, at least part of a surface of the connector being curved,
wherein the curved surface of the connector faces at least one of the pusher and pusher block, the curved surface of the connector making a movable point contact with the at least one of the pusher and the pusher block it faces, and
wherein the coupling members are elastic and extend from the second surface of the pusher to the first surface of the pusher block, the coupling members directly contacting the first surface of the pusher block.

2. The apparatus as claimed in claim 1, wherein:
a first end of each of the coupling members is coupled to the pusher within an area defined between an imaginary circumference of all the stoppers and an outer circumference of the connector, the imaginary circumference of all the stoppers being defined by an imaginary line sequentially connecting all the stoppers, and
a second end of each of the coupling members is coupled to the pusher block at a position outside the circumference of the connector.

3. The apparatus as claimed in claim 1, further comprising at least one holder protruding from the first surface of the pusher block toward the second surface of the pusher, the at least one holder contacting and surrounding the connector.

4. The apparatus as claimed in claim 1, wherein the pusher includes a pusher body having a trench, a pusher plate covering the trench, and an elastic member placed in the trench and connecting the pusher body and the pusher plate.

5. The apparatus as claimed in claim 1, wherein the connector makes a direct point of contact with each of the pusher and the pusher block.

6. The apparatus as claimed in claim 1, wherein the connector is a sphere that is movable relative to the pusher block.

7. The apparatus as claimed in claim 1, wherein the curved surface is a spherical surface.

8. The apparatus as claimed in claim 1, wherein at least part of a top surface of the pusher block is completely flat and is facing the pusher, the connector being a movable sphere in direct contact with the completely flat top surface of the pusher block.

9. The apparatus as claimed in claim 1, wherein the curved surface of the connector is in direct contact with the at least one of the pusher and the pusher block it faces.

10. The apparatus as claimed in claim 9, wherein the curved surface of the connector is non-stationary relative to the at least one of the pusher and the pusher block it faces.

11. Semiconductor test equipment, comprising:
at least one socket, the socket including a plurality of socket pins corresponding to external terminals of a semiconductor device to be tested;
socket guides fixing the socket in a stable position;
a system exchanging electrical signals with the socket; and
a match plate having a top surface connected to a pressure unit and a bottom surface opposite the top surface and connected to at least one contact apparatus, the contact apparatus corresponding to the socket and including:
a pusher having first and second surfaces, the first surface being connected to a pressure unit,
stoppers protruding from edges of the second surface of the pusher away from the pressure unit,
a pusher block having first and second surfaces facing each other, the first surface facing the pusher, and the second surface being connected to a semiconductor device, coupling members connecting the pusher to the pusher block, and a connector disposed between the pusher and the pusher block, at least part of a surface of the connector being curved, wherein the curved surface of the connector faces at least one of the pusher and pusher block, the curved surface of the connector making a movable point contact with the at least one of the pusher and the pusher block it faces, and wherein the coupling members are elastic and extend from the second surface of the pusher to the first surface of the pusher block, the coupling members directly contacting the first surface of the pusher block.

12. The equipment as claimed in claim 11, wherein a plurality of sockets and a plurality of contact apparatuses are arranged in a (m, n) matrix of m sockets and m contact apparatuses in a first direction and n sockets and n contact apparatuses in a second direction, the plurality of contact apparatuses correspond to respective ones of the plurality of sockets.

13. The equipment as claimed in claim 12, wherein the (m, n) matrix is one of (4, 8), (8, 8), (8, 16), (16, 16), and (16, 32).

14. The equipment as claimed in claim 11, wherein the connector of the contact apparatus makes a point contact with the pusher block.

15. The equipment as claimed in claim 11, wherein the connector of the contact apparatus makes a point contact with the pusher.

16. The equipment as claimed in claim 11, wherein the connector of the contact apparatus makes a direct point of contact with each of the pusher and the pusher block, the direct point of contact being a single point of contact with each of the corresponding pusher and pusher block.

17. The equipment as claimed in claim 16, wherein the connector is a non-stationary sphere.

18. The equipment as claimed in claim 11, wherein the pusher includes a trench in the second surface, the connector and the pusher being connected to each other within the trench.

19. The equipment as claimed in claim 11, wherein:

a first end of each of the coupling members is coupled to the pusher within an area defined between an imaginary line sequentially connecting all the stoppers and a circumference of the connector, and a second end of each of the coupling members is coupled to the pusher block at a position outside the circumference of the connector, and the contact apparatus further comprises at least one holder protruding from the first surface of the pusher block toward the second surface of the pusher, the at least one holder surrounding the connector.

20. The equipment as claimed in claim 11, wherein the pusher includes a pusher body having a trench, a pusher plate covering the trench, and an elastic member placed in the trench and connecting the pusher body and the pusher plate.

\* \* \* \* \*